United States Patent [19]

Kosmowski

[11] Patent Number: 4,813,825

[45] Date of Patent: Mar. 21, 1989

[54] DRILLING SPINDLE WITH PRESSURE FOOT SHUTTER

[75] Inventor: Wojciech Kosmowski, San Juan Capistrano, Calif.

[73] Assignee: Dynamotion Corporation, Santa Ana, Calif.

[21] Appl. No.: 158,390

[22] Filed: Feb. 22, 1988

[51] Int. Cl.⁴ ............................................. B23B 39/04
[52] U.S. Cl. ........................................ 408/98; 29/568; 408/67; 408/95
[58] Field of Search ................. 408/67, 95, 98, 99; 29/568

[56] References Cited

U.S. PATENT DOCUMENTS

| | | | |
|---|---|---|---|
| 3,578,827 | 5/1971 | Smith | 384/2 |
| 3,973,863 | 8/1976 | Smith | 408/241 R |
| 4,088,417 | 5/1978 | Kosmowski | 408/1 BD |
| 4,340,326 | 7/1982 | Buonauro et al. | 408/67 X |
| 4,520,551 | 6/1985 | Imhof | 29/568 |
| 4,596,067 | 6/1986 | Raiteri | 408/3 X |
| 4,596,500 | 6/1986 | Raiteri | 408/3 |
| 4,658,494 | 4/1987 | Ohtani et al. | 408/3 X |
| 4,761,876 | 8/1988 | Kosmowski | 29/568 |

FOREIGN PATENT DOCUMENTS

| | | | |
|---|---|---|---|
| 0193745 | 9/1986 | European Pat. Off. | 408/95 |
| 62-4543 | 1/1987 | Japan | 29/568 |
| 1077752 | 3/1984 | U.S.S.R. | 29/568 |
| 1286702 | 8/1972 | United Kingdom | 408/3 |

Primary Examiner—Gil Weidenfeld
Assistant Examiner—Steven C. Bishop
Attorney, Agent, or Firm—Roberts and Quiogue

[57] ABSTRACT

A drilling spindle having a pressure foot is disclosed for handling drilling tools having relatively large diameter shank regions and relatively small diameter drilling bit portions regions. The pressure foot assembly includes a shutter plate which contacts and clamps the workpiece during drilling operations. The shutter plate translates along an axis transverse to the rotor axis to align either a small aperture or a large aperture with the rotor axis. The small aperture is sized to receive the drilling tool region of the drill, and permits the drilling region to be extended therethrough while providing good clamping of the workpiece during drilling. The large aperture is sized to receive the shank region of the tool, and permits the tool to be inserted or withdrawn from the spindle during tool changing operations.

9 Claims, 3 Drawing Sheets

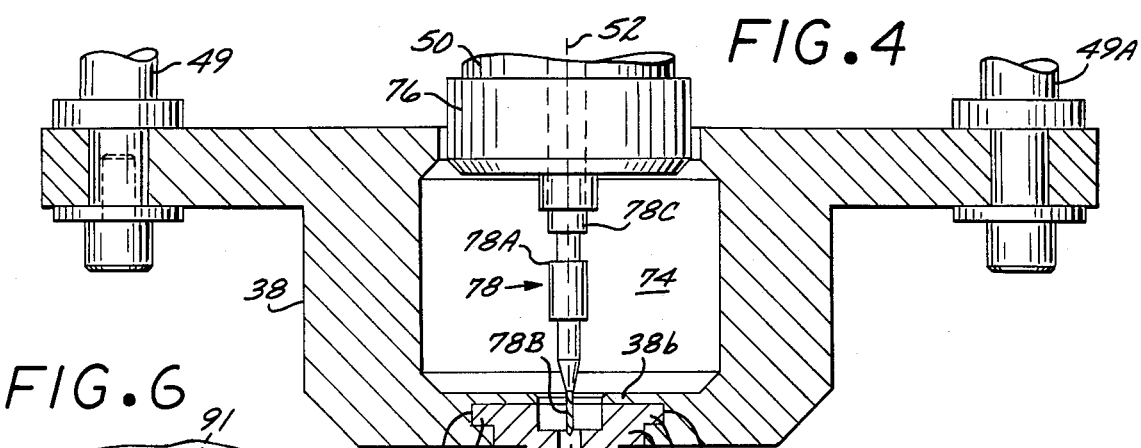
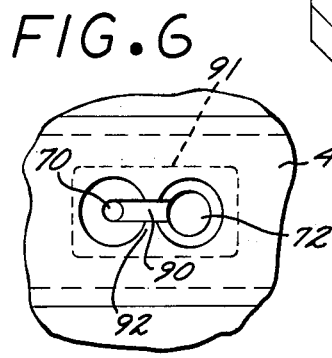
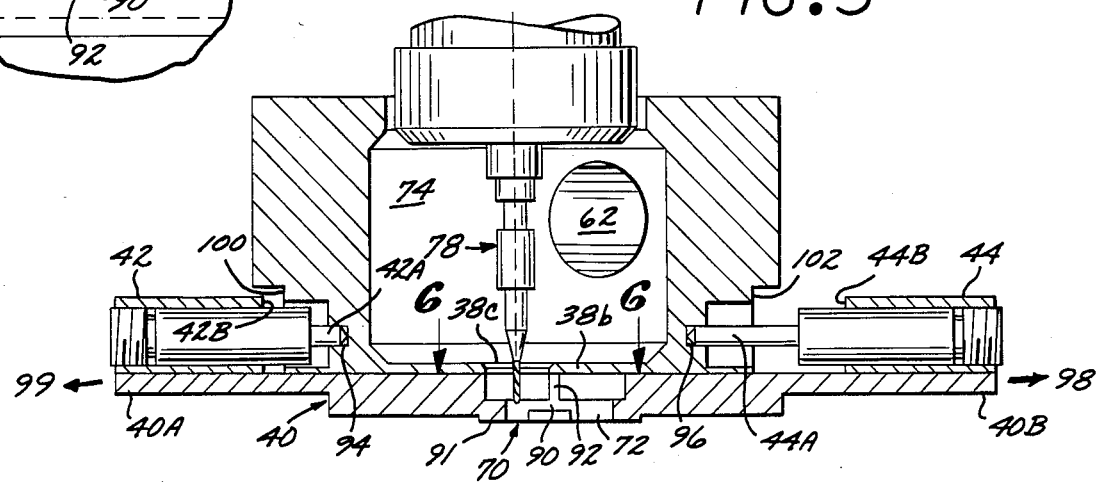
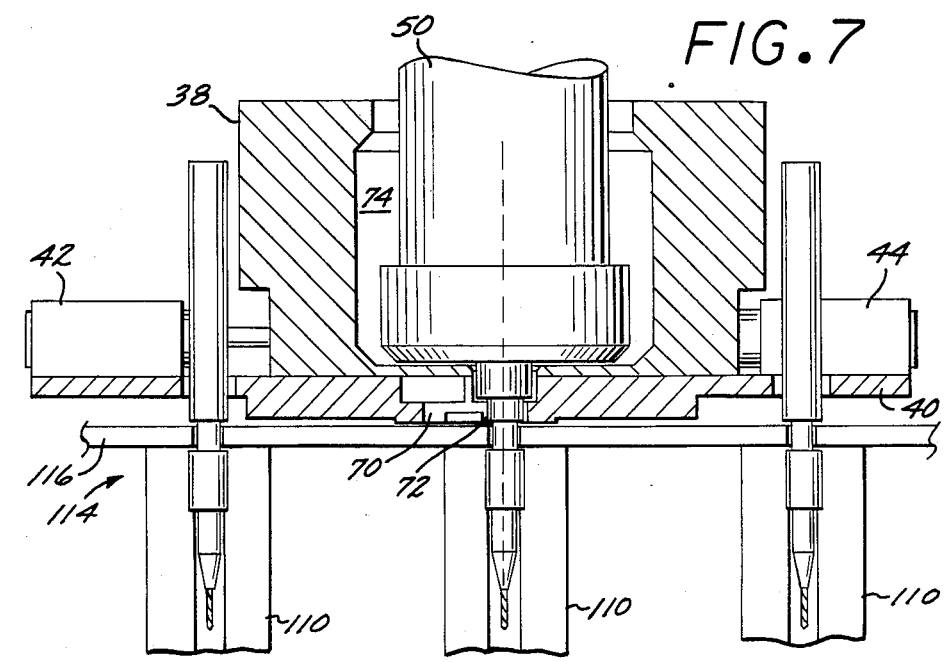

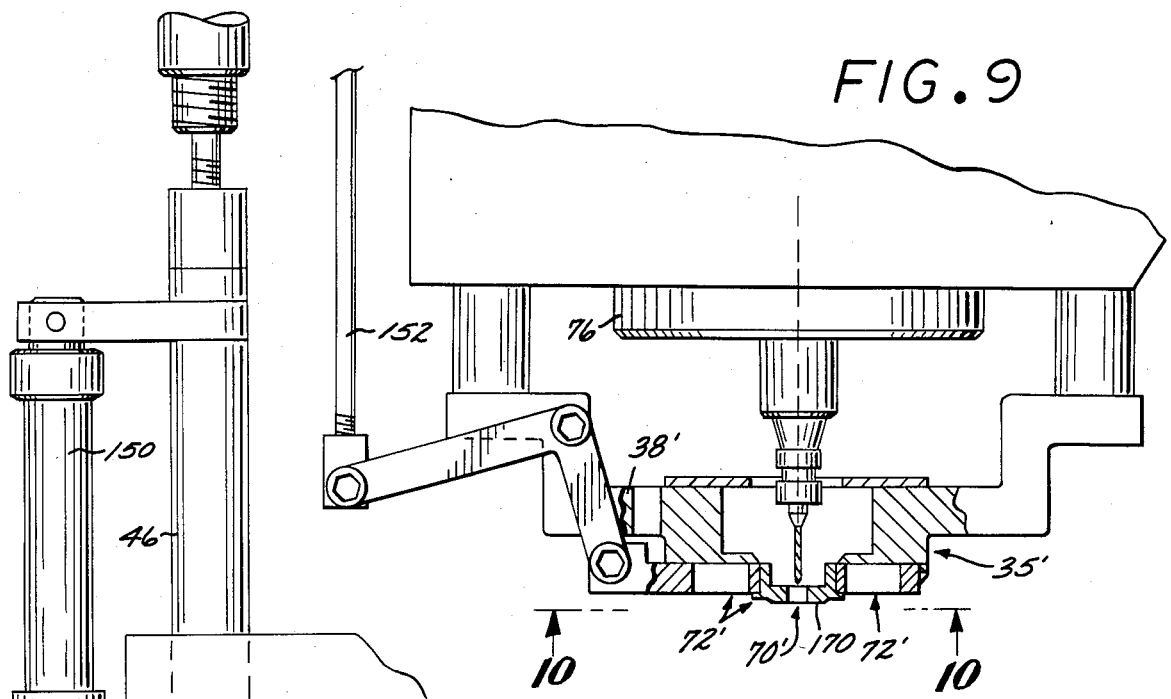
FIG. 9
FIG. 10
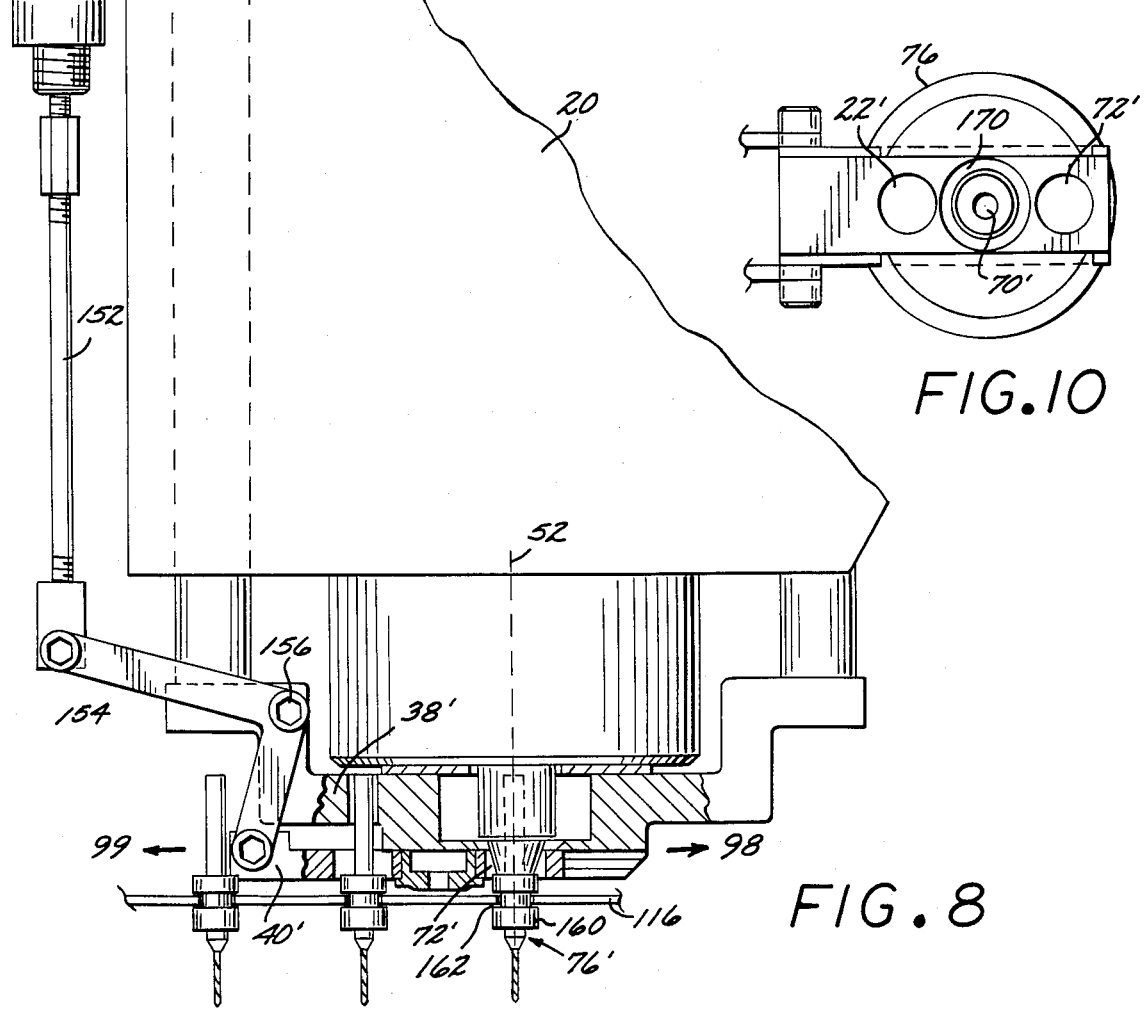
FIG. 8

# DRILLING SPINDLE WITH PRESSURE FOOT SHUTTER

BACKGROUND OF THE INVENTION

The present invention relates to drilling equipment for drilling holes in a workpiece such as a circuit board, and more particularly to a drilling spindle for feeding drilling tools having a relatively small diameter drilling bit into such a workpiece employing a pressure foot to clamp the workpiece and yet allow the drilling tool to be changed during a tool changing operation.

Printed circuit boards are virtually universal use today to mount and interconnect electrical components forming electrical circuits. Typically, the leads of the components are inserted through holes drilled in the boards to form predetermined hole patterns. Various systems are known in the art for automated drilling of the holes in printed circuit boards. Examples of such systems and components thereof are described in U.S. Pat. Nos. 4,088,417; 3,578,827 and 3,973,863. A high speed drilling system is described in U.S. Pat. No. 4,761,876 issued Aug. 9, 1988, for a High Speed Precision Drilling System, assigned to a common assignee with the present application, the entire contents of which are incorporated herein by this reference.

In order to securely clamp the workpiece during the drilling operation, a spindle pressure foot is conventionally employed, as described in U.S. Pat. No. 4,088,417. The pressure foot is mounted for translation along the spindle rotor axis and includes an aperture formed therein for permitting the drilling tool to be passed therethrough for drilling and tool changing operations. Means are typically provided for lowering the pressure foot to contact the workpiece during drilling of the workpiece, and for raising the pressure foot after completion of the drilling operation. Such pressure foot apparatus performs satisfactorily for drilling operations which employ drilling tools or bits having a uniform diameter through its shank and drilling bit portion. With these types of drilling tools, the conventional pressure foot may be employed satisfactorily to insert and remove the drilling tool from the drilling tool during tool changing operations. The aperture in the pressure foot through which the drilling tool is fed through during the drilling operation also allows the entire tool to be inserted and removed during the changing operation. A typical size for the aperture in a conventional pressure foot is 0.8 inches.

In U.S. Pat. No. 4,761,876, a new design of drilling tool is disclosed for drilling small diameter holes in the workpiece, and is particularly adapted to use with the new clip-fed tool changer disclosed in that application. This new drilling tool is characterized by a relatively large diameter shank portion which narrows to a small diameters drill tip, with a groove formed in the shank for fitting with the tool changer capture plate. Alternatively, a collar is fitted on the shank of the drill tool with a groove formed therein formed to serve a similar purpose. One problem with using a conventional pressure foot with such a drilling tool is that the aperture in the pressure foot must be made large enough to accommodate the relatively large diameter shank or collar so that the tool may be changed through the opening in the pressure foot. Because the drill bit portion is substantially smaller than the shank, e.g., less than 0.050 inches, the clamping of the workpiece by the pressure foot is distanced from the bit, allowing the workpiece to climb up the bit as the bit is fed into the workpiece. This leads to drill "wander" and decreases the quality of the hole.

It would therefore represent an advance in the art to provide a drilling spindle with a pressure foot apparatus which securely clamps the workpiece during drilling operations, yet allows the drilling tools to be changed conveniently.

SUMMARY OF THE INVENTION

A new drilling spindle having a pressure foot is disclosed for handling drilling tools having relatively large diameter shank regions and relatively small diameter drilling bit regions while providing good clamping of the workpiece during drilling operations. The spindle includes, in the conventional manner, a rotor shaft mounted for linear translation and rotary movement with respect to a rotor axis, means for imparting rotational forces to said rotor and means for imparting translational forces to translate the rotor along the axis.

The drilling spindle further includes a spindle pressure foot assembly for clamping the workpiece as it is being drilled. The assembly includes a structure defining a pressure foot surface for contacting and clamping the workpiece as it is being drilled. A first aperture means is provided for defining a first aperture through the surface defining structure sized to accommodate the drilling bit region of the tool. A second aperture defining means is provided for defining a second aperture through the surface defining structure sized to accommodate the diameter of the shank region of the drilling tool.

The spindle further includes means for positioning the respective first and second aperture defining means for (i) aligning the first aperture with the axis of the rotor during a drilling operation so that the drilling portion of the drilling tool may be fed through the first aperture and into the workpiece to drill a hole in the workpiece, with the pressure foot surface contacting the workpiece adjacent the periphery of the hole in the workpiece, thereby preventing the workpiece from climbing the bit; or (ii) aligning the second aperture with the rotor axis during tool changing operations to allow the drilling bit region and shank region of the drilling tool to extend through the second aperture to insert or remove the tool from the spindle.

In a preferred embodiment, the first and second aperture defining means comprises an aperture shutter plate mounted for translational movement in the surface defining structure along an axis substantially transverse to said rotor axis, the plate having formed therein the first aperture and the second aperture. The positioning means includes means for translating the plate along the transverse axis.

BRIEF DESCRIPTION OF THE DRAWINGS

These and other features and advantages of the present invention will become more apparent from the following detailed description of exemplary embodiments thereof, as illustrated in the accompanying drawings, in which:

FIG. 4 is a broken-away cross-sectional view of the drilling spindle of FIG. 1, taken along line 4—4 of FIG. 2.

FIG. 5 is a broken-away cross-sectional view of the drilling spindle of FIG. 1, taken along line 5—5 of FIG. 2.

FIG. 6 is a top view of a portion of the shutter plate of the spindle shown in FIGS. 1-5.

FIG. 7 is a broken-away cross-sectional view of the drilling spindle of FIG. 1, taken along line 7—7 of FIG. 2.

FIGS. 8-10 depict an alternate embodiment of the invention.

DETAILED DESCRIPTION OF THE DISCLOSURE

A drilling spindle 20 embodying a preferred embodiment of the present invention is shown in FIGS. 1-7. As will be appreciated by those skilled in the art, the spindle 20 includes a spindle rotor 50 (FIGS. 2, 5, 7) mounted for rotation about rotor axis 52. The spindle 20 further comprises means for imparting rotational forces for rotating the rotor about its axis during the drilling operation, and means for imparting translational forces for translating the rotor upwardly and downwardly along the rotor axis 52 to feed the drilling tool into and out of the workpiece, and for drill changing operations. Apparatus for implementing these means for imparting rotational and translational forces on the rotor are known to those skilled in the art. Exemplary apparatus is disclosed in the referenced pending patent application, Ser. No. 853,662, and comprises a rotary motor for imparting the rotational forces on the rotor, with rotary air bearings for supporting the rotor to allow substantially frictional rotation and translation. The apparatus disclosed in the referenced pending patent application, Ser. No. 853,662, further includes a linear motor for imparting the translational forces for causing the rotor to translate along the rotor axis.

Figure 1:
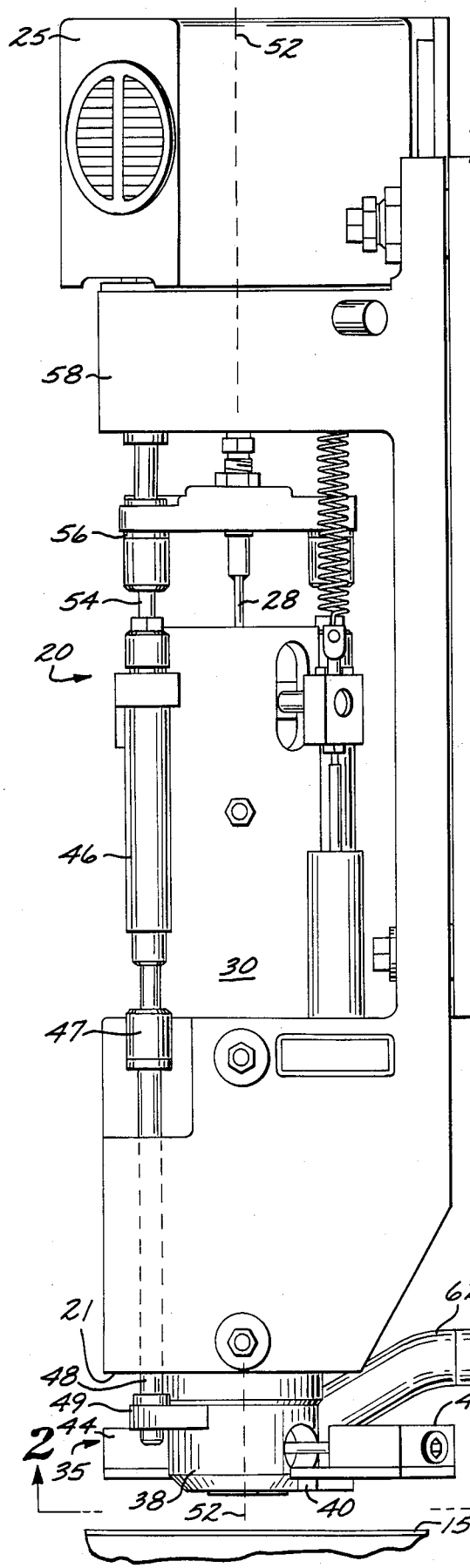
FIG. 1 is a side elevation view of a drilling spindle embodying the invention.

The means for imparting the rotational forces to the rotor 50 is generally depicted as element 30 in FIG. 1, and the means for imparting translational forces to the rotor is generally depicted as element 25. Element 30 preferably comprises a rotary motor and rotary air bearings as described in U.S. Pat. No. 4,761,876. Similarly, the element 25 preferably comprises a linear motor coupled to the rotor 50 by thrust shaft 28, as described in U.S. Pat. No. 4,761,876. Other means for imparting rotational and linear forces to perform the same or similar functions are known in the art, and may be substituted for these particular apparatus. For example, the linear translating means may comprise means for translating the spindle body upwardly or downwardly, carrying the rotor with it.

Typically, the spindle 20 is employed in a drilling system which includes X and Y positioning means for positioning the spindle at desired locations relative to the X-Y plane in which the workpiece 15 (FIG. 1) is disposed for the drilling operation. The rotor may be translated along the Z axis by the linear translating means for drilling and tool changing operations.

The spindle 20 further comprises a pressure foot assembly 35 which is coupled to the bottom of the spindle housing. The pressure foot assembly 35 comprises housing 38, shutter plate 40, and first and second shutter plate pneumatic cylinder assemblies 42 and 44. The pressure foot assembly 35 is mounted for translational movement along the axis 52 by a pair of pneumatic cylinder assemblies, only one of which is visible in FIG. 1. The supporting pneumatic cylinder assemblies each comprises a double acting cylinder 46, with a lower rod or piston 48 extending through bushing 47 and having an end secured to the housing 38 by a bracket 49. The cylinder assemblies further comprise an upper rod or piston member having an end secured to the spindle housing. The cylinder assemblies provide a means for lifting or lowering the pressure foot 35 with respect to the lower face 21 of the spindle 20. The pressure foot translating means per se is known in the art, and need not be described in further detail herein.

The pressure foot assembly 38 further comprises a tube 62 which communicates with the interior chamber of the pressure foot as seen in FIGS. 4-7. The tube 42 is coupled to a source of vacuum (not shown) in order to remove chips from the workpiece and drilling tool vicinity during the drilling process.

Figure 2:
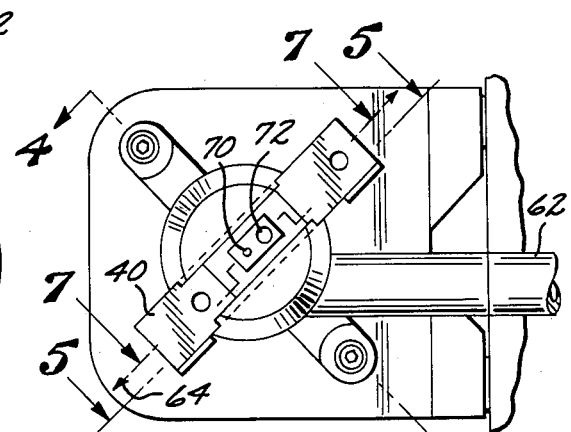
FIG. 2 is a bottom view of the spindle apparatus of FIG. 1 taken along line 2—2 of FIG. 1.
Figure 3:
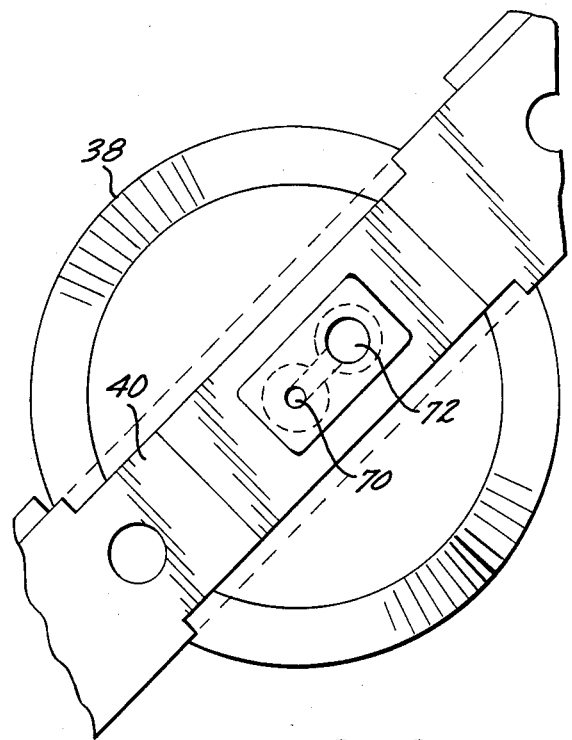
FIG. 3 is a broken-away enlarged bottom view of a portion of the drilling spindle of FIG. 1.

Referring now to FIG. 2, a bottom view of the pressure foot assembly 35 discloses the two apertures 70 and 72 defined in the shutter plate 40. The apertures are seen clearly in the enlarged view of FIG. 3. The shutter plate 40 provides a structure defining a pressure foot surface 91 for clamping the workpiece as it is being drilled. This surface 91 is indicated, for example, in phantom in FIG. 6. The cylinders 42 and 44 provide a means for translating the shutter plate 40 along the axis 64 (FIG. 2) so that either the aperture 70 or aperture 72 is aligned with the rotor axis 52. A typical diameter size for the small aperture 70 is 0.050 inches, and a typical diameter size for the large aperture 72 is 0.80 inches. The shutter plate 40 is preferably fabricated from an impact resistant material, such as steel or high strength plastic.

Referring now to FIGS. 4-7, it will be seen that the pressure foot housing 38 defines a chamber 74 through which the rotor 50, chuck 76 and drilling tool 78 may be selectively inserted and withdrawn. In both FIGS. 4 and 5, the rotor and chuck is shown in a raised position with respect to the pressure foot assembly, and in FIG. 7, the rotor is shown in a lowered condition for tool changing operations. As is well known in the art, the chuck 76 provides a means for concentrically securing the drilling tool to the rotor 50 to carry out the drilling operation. Such a chuck may comprises centrifugal chuck as described in U.S. Pat. No. 4,761,876.

In FIG. 4, the plate 40 is positioned so that the aperture 70 is aligned with the rotor axis 52. FIG. 4 also illustrates the manner in which the shutter plate 40 is slideably secured to the bottom of the pressure foot housing 38a. As shown in cross-section, the plate 40 includes a pair of protruding ear members 80, 82 which are received within the corresponding relieved areas 84 and 86 formed in the housing structure 38a. The ears 80 and 82 therefore provide a means of retaining the plate in the elongated slot 88 formed in the structure 38a, while allowing the plate 40 to translate along the axis 64.

The bottom of the chamber 74 is defined partially by the partial floor element 38b. As is evident in FIG. 5, the element 38b has formed therein an opening 38c in alignment with the axis 52, and sized to admit the drilling tool therethrough.

A partial slot 90 is formed in the interior of the plate 40 to allow the end of the tool 78 to clear the plate structure when the tool is raised and the plate is translated from one position to the other, without requiring that the pressure foot assembly 38 be lowered relative to the spindle body. The partial slot is evident in FIG. 5, and is further illustrated in the top view of the shutter plate of FIG. 6.

The drilling tool 78 in the disclosed embodiment of FIGS. 1-7 comprises a drill bit for drilling small diameter holes in the workpiece. The bit comprises a relatively large diameter shank region 78A and a relatively small diameter drill bit region 78B. In this embodiment, the tool 78 also comprises a shank groove 78C. For drilling operations, the shutter plate 40 is actuated to the position shown in FIG. 5, i.e., with the small aperture 70 aligned with the rotor axis 52 and the drilling tool 78, which is concentrically aligned with the axis 52 by the chuck 76. The pressure foot translating means is actuated to lower the foot to clamp the workpiece, and with the rotor 50 rotating at high speed, the rotor 50 is translated downwardly to feed the bit portion 78B of the tool 78 into the workpiece. The small aperture 70 readily accommodates the bit portion 78B. During drilling operations, the rotor is not translated downwardly far enough for the shank region 78A to reach the aperture 50, which is too small to accept the shank region.

FIG. 7 illustrates the spindle 20 in position for a tool changing operation. Here, the aperture plate 40 has been translated to align the large aperture 72 with the drilling tool 76. The drilling tools shown in this embodiment are held in clips 110, which are inserted in magazines comprising the tool changer 114, as more fully described in pending application, Ser. No. 853,662. Each clip 110 holds a plurality of drilling tools 78 aligned along an axis. The tool changer 115 includes a locking plate 116 having a corresponding plurality of slots 118 formed therein and aligned with the clip axis. Each slot 118 in turn defines a plurality of keyhole-shaped openings, one for each tool in the particular clip. The tool changer includes means for translating the locking plate along the clip axis to either concentrically align the small opening portion of the keyhole with the tools to lock their position, or to align the large portion of the keyhole opening with the tool. In the latter position, the tools may be inserted or removed from the clip through the locking plate. The tool changer is mounted on a pneumatic cylinder (not shown in the figures) for selectively raising or lowering the tool changer in the Z axis, i.e., parallel to the rotor axis. This operation is more fully described in U.S. Pat. No. 4,761,876. For purposes of the present application, it is sufficient that the tool changer be configured to allow tools to be removed from the tool changer 114 by the spindle 20 or inserted into the spindle 20 from the tool changer.

FIG. 5 illustrates the cooperative operation of the pneumatic cylinders 42 and 44. Each cylinder is operated by a pressurized fluid, and is single acting. Thus, each cylinder operates positively by exerting a force tending to extend its respective piston rod. The cylinder 42 and 44 are respectively fixedly secured to respective ends of the shutter plate 40. Thus, cylinder 42 is secured to end 40A of plate 40, and cylinder 44 is secured to end 40B of the plate 40. Piston 42A is operated by cylinder 42 and extends into opening 94 formed in the pressure foot housing; piston 44A of cylinder 44 extends into opening 96.

To align the small aperture 70 with the rotor axis 52, cylinder 44 is actuated by pressurizing the cylinder and the pressure to cylinder 42 is released. This results in extension of piston 44A, and translates the shutter plate in the direction of arrow 98 to the position shown in FIG. 5, with piston 42A in the compressed position. To align the large aperture 72 with the rotor axis 52, the cylinder 42 is pressurized and pressure to cylinder 44 released. Piston 42A is extended, thereby exerting a translating force on the shutter plate 40, causing the plate to translate in the direction of arrow 99 to align the aperture 72 with axis 52. This position is illustrated in FIG. 7.

Shoulders 100 and 102 are formed in the pressure foot housing 38, defining stop surfaces contacted by the respective cylinder housing surfaces 42B and 44B for limiting the travel of the plate in the respective directions of arrows 98 and 99. The depth of the shoulders is selected so that, when the respective cylinder surface engages the shoulder, the respective aperture 70 or 72 will be in alignment with the axis 52. Thus, pressurizing one cylinder while releasing the pressure to the other cylinder automatically results in alignment of the respective aperture with the rotor axis.

One feature of the invention is that, with the shutter plate 40 translated to align the small aperture 70 with the rotor axis 52, the bottom wall 38b of the housing 38 seals off the large aperture 72 from the chamber 74. This sealing prevents the large aperture from impairing the vacuum operation of drawing chips through the small aperture 70 and through the chamber 74 into the vacuum tube 62.

Having described the important structural characteristics of the embodiment of FIGS. 1-7, the operation of the spindle will now be described for exemplary tool changing modes. An exemplary tool "drop off" mode, wherein the tool mounted in the spindle is dropped off at the tool changer 114, comprises the following steps:

1. Move the rotor along the Z axis to the raised or "up" position within the spindle, with the pressure foot in the "down" position, i.e., with the pressure foot translating means actuated to extend the pressure foot downwardly.

2. Move the spindle in the X and Y directions to the tool changing position, i.e., by positioning the spindle directly over the tool changer with the axis 52 aligned with the opening in the magazine clip in which the tool is to be inserted.

3. Translate the shutter plate 40 so that the large aperture 72 is aligned with the rotor axis 52, so that the drill shank region clears the large aperture.

4. Translate the pressure foot upwardly by actuating the pressure foot translating means.

5. Translate the lock plate 116 of the tool changer to the open position, i.e., so that the large keyhole opening portion of the slot is aligned with the clip opening into which the tool 78 is to be inserted.

6. Move the rotor 50 and the drilling tool 78 downwardly along the Z axis.

7. Move the magazine to the up position so that the drilling tool portion is inserted into the clip 110 opening, as shown in FIG. 7.

8. Translate the locking plate 116 to the closed position so that the small keyhole opening portion is aligned with the inserted drilling tool to lock the tool in place in the clip.

9. Move the magazine downwardly along the Z axis, carrying the tool away from the rotor.

10. Raise the rotor 50 along the Z axis away from the tool changer.

11. Translate the pressure foot downwardly.

12. Translate the shutter plate to align the small aperture with the rotor axis.

13. Return the spindle to its original position.

An exemplary tool "pick up" mode, wherein a tool stored in the tool changer is inserted in the rotor chuck, comprises the following steps:

1. Move the rotor along the Z axis to the raised position with the pressure foot translated downwardly.
2. Move the spindle in the X and Y axes in position over the tool changer.
3. Translate the shutter plate so that the large aperture 72 is aligned with axis 52.
4. Translate the pressure foot upwardly.
5. Translate the tool changer lock plate to the open position.
6. Translate the rotor downwardly along the Z axis.
7. Move the magazine upwardly to engage the tool shank within the rotor chuck.
8. Translate the tool changer downwardly along the Z axis to clear the spindle and tool.
9. Translate the rotor in the Z axis to the raised position.
10. Translate the locking plate 116 to the closed position so that the small keyhole opening portion is aligned with the tool aperture in the clip.
11. Translate the pressure foot downwardly.
12. Translate the shutter plate to align the small aperture with the rotor axis.
13. Return the spindle to its original position.

It will be appreciated that the spindle operation is controlled in the conventional manner by a drilling system controller. The controller is programmed to carry out desired drilling and tool changing operations, by controlling the operation of the various spindle drive motors, pneumatic cylinders, air bearings and the like, as well as the operations of other elements in the drilling system. Thus, the system controller will control the operations of the cylinders 42 and 44 translating the shutter plate, for example. An exemplary system controller is described in U.S. Pat. No. 4,761,876.

An alternate embodiment is illustrated in FIGS. 8–10, wherein the means for translating the shutter plate comprises a pivoted linkage driven by an actuating rod instead of the pneumatic cylinders 42–44 of the embodiment shown in FIGS. 1–7. This embodiment is well suited for spindles adapted to drill relatively large diameter holes in a workpiece. Thus, the diameter of the pressure foot housing, for example, may be somewhat larger than the diameter of the pressure foot housing of the embodiment of FIGS. 1–7.

The pressure foot translating piston 46 carries a further pneumatic cylinder assembly 150. The piston 152 actuated by the cylinder 150 serves as an actuating rod which is pivotally connected to one end of the L-shaped linkage 154, e.g., by a bolt and nut fastener. The linkage 154 pivots about point 156 on the structural element connecting the piston 46 to the pressure foot housing 38'. As in the embodiment shown in FIGS. 1–7, the shutter plate 40' is mounted for translational movement along an axis transverse to the rotor axis. Here, however, the shutter plate translating force is exerted by the actuating rod 152 acting on the pivoted linkage 154. The cylinder 150 is double acting, so that the piston 152 may be either withdrawn or extended, depending on the pneumatic pressure applied to the cylinder in the conventional manner.

FIG. 8 shows the piston 152 in its withdrawn state, so that the plate 40' has been translated in the direction of arrow 99. In this position, the large aperture 72' is aligned with the rotor axis 52, permitting tool changing operation as shown in FIG. 8. Thus, the drilling tool 76' may be picked up by the rotor chuck or dropped off at the tool changer.

In this embodiment, the drilling tool 76' comprises a collar 160 having a circumferential groove 162 formed therein. This fulfills a similar function as the groove 78C formed in the shank of tool 76 (FIG. 4), in that the groove in the collar mates with the edges of the locking plate 116 of the tool changer.

FIG. 9 illustrates the piston 152 in its extended position, having translated the plate 40' in the direction of arrow 98 (FIG. 8). In this position, the small aperture 70' is aligned with the rotor axis 52 for drilling operations.

The form of the shutter plate 40' differs somewhat from the plate 40 of the first embodiment. The plate 40' has three relatively large apertures 72' formed threin, as shown in FIGS. 8–10. An circular insert member 170 is fitted into the central large opening 72', and the small aperture 70' is defined within the insert 170 (see FIG. 10). The large apertures 72' on either side of the insert 170 are spaced by a distance equal to the spacing between the tools held in the tool changer. The pressure foot housing 38' is larger than housing 38 (FIGS. 1–7); the plurality of large apertures 72' receives a tool in the magazine adjacent the tool being picked up or dropped off. The adjacent tool would otherwise block the tool changing operation in this embodiment.

A drilling spindle has been disclosed for handling drilling tools having relatively large diameter shank regions, defined by the drilling tool shank or by a collar fitted over the shank, and a relatively small diameter drilling bit region. The shutter plate provides the advantage of secure clamping of the workpiece, thereby substantially preventing the workpiece from climbing the bit. The shutter plate also provides the capability of quick, efficient tool changing operations, an important feature for high throughput of the system, particualarly for automated drilling systems.

It is understood that the above-described embodiments are merely illustrative of the possible specific embodiments which may represent principles of the present invention. Other arrangements may readily be devised in accordance with these principles by those skilled in the art without departing from the scope of the invention. For example, the shutter plate 40 may be replaced by a pair of half-plates having ends with semi-circular openings defined therein which meet to define the aperture, and then separate to enlarge its size. By moving the half-plates, the aperture defined by the semi-circular openings in the half-plates can be enlarged or made smaller, in a manner analogous to a camera shutter. Also, the typical aperture sizes given above (0.050 inches and 0.800 inches, respectively) are exemplary only, and may vary for different applications in dependence on the drill bit dimensions.

What is claimed is:

1. A drilling spindle for handling drilling tools having relatively large diameter shank regions and relatively small diameter drilling bit regions while providing good clamping of the workpiece during drilling operations, comprising:
  a drilling spindle comprising a rotor shaft mounted for linear translation and rotary movement with respect to a rotor axis, means for imparting rotational forces to said rotor and means for imparting translational forces to translate said rotor along said axis;

a spindle pressure foot assembly for clamping the workpiece as it is being drilled, said assembly comprising:

structure for defining a pressure foot surface for contacting and clamping the workpiece as it is being drilled;

first aperture means for defining a relatively small first aperture through said surface defining structure sized to accommodate date the drilling bit region but not the shank region of said drilling tool;

second aperture defining means for defining a second aperture through said surface defining structure sized to accommodate the diameter of said shank region of said drilling tool;

means for positioning said respective first and second aperture means for (i) aligning said first aperture with the axis of said rotor during a drilling operation so that said drilling bit region of said drilling tool may be fed through said first aperture and into the workpiece to drill a hole in the workpiece, with the surface defining structure of said pressure foot contacting the workpiece adjacent the periphery of the hole in the workpiece, thereby substantially preventing the workpiece from climbing the bit, or (ii) aligning the second aperture with the rotor axis during a tool changing operation to allow the drilling region and shank region of the drilling tool to extend through the second aperture to insert into or remove said tool from said spindle.

2. The drilling spindle of claim 1 wherein said first and second aperture defining means comprise:

a shutter plate mounted for translational movement along an axis substantially transverse to said rotor axis, said plate having defined therein said first aperture and said second aperture; and wherein said positioning means comprises means for translating said plate along said axis to selectively align either said first or said second aperture with said rotor axis.

3. The spindle of claim 2 wherein said pressure foot assembly further comprises housing means for defining a chamber around the tool receiving end of said rotor and drilling tool spindle, means for connecting a source of vacuum to said chamber for drawing chips from the workpiece and around the drilling tool through said first aperture, and structural means aligned with said second aperture when said first aperture is aligned with the drilling tool to substantially seal said second aperture from the chamber and prevent air to be drawn therethrough by the source of vacuum.

4. The drilling spindle of claim 2 wherein said means for translating said shutter plate comprises:

(i) a first pneumatic cylinder arranged to exert a first translating force on said plate in a first direction to translate the plate to align said first aperture with said rotor axis; and (ii) a second pneumatic cylinder arranged to exert a second translating force on said plate in a second direction to translate the plate to align said second aperture with said rotor axis.

5. The drilling spindle of claim 2 wherein said means for translating said shutter plate comprises:

(i) a pneumatic cylinder assembly having a selectably extendable or retractable piston element;

(ii) a linkage member mounted for pivotal movement on said pressure foot adjacent an end of said shutter plate, said linkage having a first end pivotally connected to said piston element and a second end pivotally connected to said end of said shutter plate, whereby retraction or extension of said piston force exerts a translating force on said plate through said linkage to translate said shutter to align either said first or said second aperture with said rotor axis.

6. The drilling spindle of claim 2 wherein said shutter plate comprises an elongated plate member having a parallel sides aligned with said transverse axis, and comprising ear-like surfaces protruding from each side, and wherein said pressure foot assembly comprises a housing structure having an elongated slot opening defined therein for receiving said shutter plate in sliding relationship, said opening further defining relieved regions for accepting said protruding ear-like surfaces of said plate, said relieved regions and said ear-like surfaces cooperating to retain the plate in said housing in a direction substantially parallel to said rotor axis while permitting sliding movement of said plate relative to said housing along said transverse axis.

7. The drilling spindle of claim 2 wherein said shutter plate further comprises a structural region extending between and serving to partially define said first and second apertures, and wherein a relieved groove is formed in said structural region adjacent the rotor, said groove having a depth for reducing the clearance required between said plate and said drilling tool bit region when said plate is translated to align the respective aperture with the rotor axis.

8. A drilling spindle for handling drilling tools having relatively large diameter shank regions and relatively small diameter drilling bit regions while providing good clamping of the workpiece during drilling operations, comprising:

a drilling spindle comprising a rotor shaft mounted for linear translation and rotary movement with respect to a rotor axis, means for imparting rotational forces to said rotor, means for imparting translational forces to translate said rotor along said axis and a chuck for selectively concentrically securing the drilling tool to the drilling end of the rotor shaft;

a spindle pressure foot assembly for clamping the workpiece as it is being drilled, said assembly comprising:

a pressure foot housing structure;

a shutter plate for defining a pressure foot surface for contacting and clamping the workpiece as it is being drilled;

means for securing said plate to said housing structure, said means permitting sliding of said plate relative to said housing structure along an axis substantially transverse to said rotor axis;

first aperture means for defining a relatively small first aperture through said shutter plate and said surface sized to accommodate the drilling bit region but not the shank region of said drilling tool;

second aperture defining means for defining a second aperture through said shutter plate and said surface sized to accommodate the diameter of said shank region of said drilling tool; and means for sliding said plate for (i) aligning said first aperture with the axis of said rotor during a drilling operation so that said drilling bit region of said drilling tool may be fed through said first aperture and into the workpiece to drill a hole in the workpiece, with said pressure foot surface contacting the workpiece adjacent the periphery of the hole in the workpiece, thereby substantially preventing the workpiece from climbing the bit, or (ii) aligning the second aperture with the rotor axis during a tool changing operation to allow the drilling region and shank region of the drilling tool to extend through the second aperture to insert into or remove said tool from said spindle.

9. The spindle of claim 8 wherein said pressure foot assembly further comprises housing means for defining a chamber around the tool receiving end of said rotor and drilling tool spindle, means for connecting a source of vacuum to said chamber for drawing chips from the workpiece and around the drilling tool through said first aperture, and structural means aligned with said second aperture when said first aperture is aligned with the drilling tool to substantially seal said second aperture from the chamber and prevent air to be drawn therethrough by the source of vacuum.

* * * * *